(12) United States Patent
Wiley et al.

(10) Patent No.: US 10,856,448 B1
(45) Date of Patent: Dec. 1, 2020

(54) COMPRESSED AIR COOLING

(71) Applicant: Facebook, Inc., Menlo Park, CA (US)

(72) Inventors: Scott C. Wiley, Los Altos, CA (US);
Andrew Gold, Los Altos, CA (US);
Ahmad Byagowi, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 35 days.

(21) Appl. No.: 16/195,356

(22) Filed: Nov. 19, 2018

(51) Int. Cl.
*H05K 7/20* (2006.01)

(52) U.S. Cl.
CPC ..... *H05K 7/20745* (2013.01); *H05K 7/20145* (2013.01); *H05K 7/20154* (2013.01); *H05K 7/20727* (2013.01); *H05K 7/20827* (2013.01); *H05K 7/20836* (2013.01)

(58) Field of Classification Search
CPC ........... H05K 7/20745; H05K 7/20836; H05K 7/20154; H05K 7/20727; H05K 7/20145; H05K 7/20827; H05K 7/20163
USPC ............................. 361/679.47, 691, 702, 703
See application file for complete search history.

(56) References Cited

U.S. PATENT DOCUMENTS

| | | | | |
|---|---|---|---|---|
| 5,566,377 A * | 10/1996 | Lee | ............................ | G06F 1/20 165/80.3 |
| 5,583,316 A | 12/1996 | Kitahara | | |
| 6,330,153 B1 | 12/2001 | Ketonen | | |
| 7,477,516 B2 * | 1/2009 | Joshi | ...................... | H01L 23/467 165/80.3 |
| 7,751,188 B1 * | 7/2010 | French | ............... | H05K 7/20736 165/104.33 |
| 8,208,250 B2 * | 6/2012 | Mongia | ................... | G06F 1/203 165/80.2 |
| 8,726,681 B2 * | 5/2014 | Williams | .................. | G06F 1/20 361/690 |
| 2002/0062650 A1 * | 5/2002 | Dukhan | ............. | H05K 7/20145 62/5 |
| 2003/0053293 A1 | 3/2003 | Beitelmal | | |
| 2008/0315402 A1 | 12/2008 | Hwang | | |
| 2009/0000773 A1 * | 1/2009 | Levy | ....................... | F25B 9/065 165/104.34 |
| 2010/0024445 A1 * | 2/2010 | Cichanowicz | ..... | H05K 7/20727 62/86 |
| 2013/0058042 A1 | 3/2013 | Salamon | | |
| 2015/0208554 A1 * | 7/2015 | Leigh | ........................ | G06F 1/20 165/80.3 |
| 2015/0327353 A1 * | 11/2015 | Dickover | ............. | H05K 7/2039 361/679.54 |
| 2016/0270254 A1 * | 9/2016 | Brianese | ............ | H05K 7/20154 |
| 2017/0241676 A1 * | 8/2017 | Kim | .................... | H05K 7/20927 |

* cited by examiner

*Primary Examiner* — Jayprakash N Gandhi
*Assistant Examiner* — Stephen S Sul
(74) *Attorney, Agent, or Firm* — Van Pelt, Yi & James LLP (57) ABSTRACT

Compressed air cooling is disclosed. In an embodiment, an assembly includes an input configured to receive compressed air. The assembly also includes an expansion chamber configured to at least in part contain an expansion of the compressed air. The assembly also includes a base configured to be thermally cooled via the expansion of the compressed air and configured to be coupled to an electronic component.

20 Claims, 8 Drawing Sheets

COMPRESSED AIR COOLING

BACKGROUND OF THE INVENTION

The performance of electronic components such as computer chips is affected by its operating temperature. If components are not being cooled sufficiently, they do not perform as well. As electronic components become more powerful, they also tend to generate more heat. Data centers include server racks that each contain electronic components that generate heat. The heat can significantly degrade the performance of the data center, e.g., causing request handling to be slow, consuming large amounts of energy, and causing components to malfunction prematurely. Existing cooling methods are becoming inadequate for maintaining an optimal temperature environment for electronic components or are impractical to use for cooling electronics. For example, liquid cooling, which is used in automotive settings can achieve a desired temperature. However, liquid cooling is not ideal for settings such as data centers because of the tendency of liquid cooling systems to leak.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
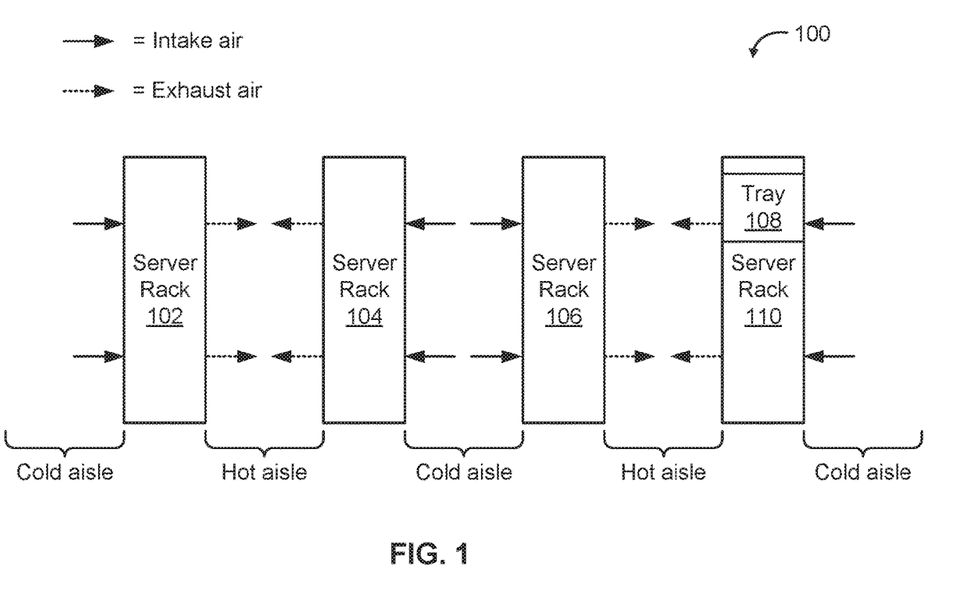
FIG. 1 shows an example of a data center in which the compressed air cooling techniques described here can be applied.

FIG. 1 shows an example of a data center in which the compressed air cooling techniques described here can be applied. A data center houses network infrastructure devices such as server racks. A server rack is made up of a stack of network racks (also called trays), which are further described in FIG. 2. When a user visits a Web page, uses an application, or otherwise interacts with an Internet-based service, the user's requests are handled by data centers. There have been efforts to standardize server racks. For example, the Open Compute Project's Open Rack V2 sets specifications and design guidelines for rack dimensions, rack-mounted components, and the like. The compressed air cooling techniques described below can be applied to cool a variety of electronic components (such as integrated circuit chips) including those in server racks complying with the Open Rack V2 specification.

The data center 100 includes four servers 102, 104, 106, and 110. The aisles between the servers are designated cold aisles or hot aisles because the air in the aisle is relatively cooler in the cold aisles and relatively hotter in the hot aisles. Air is taken into a server rack from the cold aisle and exhaust air is expelled into the hot aisles. This helps to cool or at least prevent overheating of electronic components inside the server racks. Cold air can be supplied by output of an air conditioning system or compressed air source as further described with respect to FIG. 3. In this example configuration, the aisles between server racks 102 and 104 and between server racks 106 and 110 are hot aisles, while the other aisles are cold aisles. Thus, input faces of server racks 104 and 106 face each other, while output faces of server racks 102 and 104 and 106 and 110 face each other.

Figure 2:
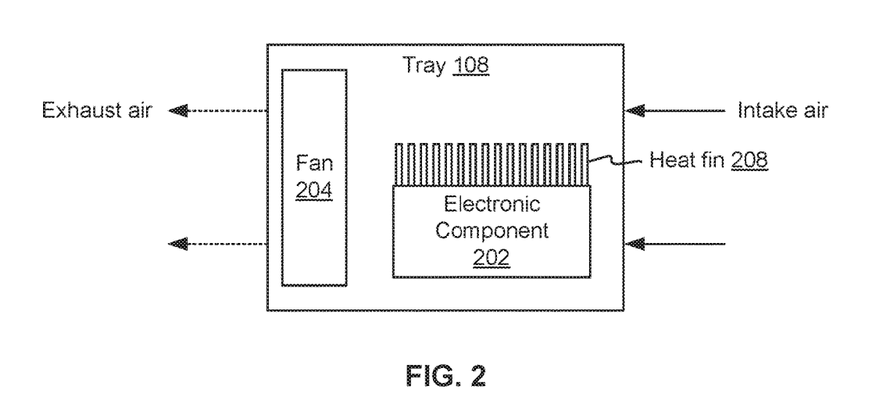
FIG. 2 is a block diagram of a tray in a server rack.

FIG. 2 is a block diagram of a tray in a server rack. Tray 108 can be installed inside server rack 110, and a stack of trays can be provided in a server rack. Electronic components in the tray tend to generate heat, which can degrade performance. Components in the tray can be cooled using the compressed air cooling techniques described below, but first a conventional cooling technique for tray 108 will be described.

Tray 108 includes one or more electronic components 202 (here, for simplicity, only a single electronic component is shown) and a fan 204. The operation of the fan causes air to be taken in as shown by the arrows (for example cool air from a cold aisle is drawn into the tray), which cools the component 202 as it passes through the interior of the tray. The cool air, which has been heated by the electronic component 202, is then expelled as exhaust air (for example to a hot aisle). A heat fin 208 may be provided on or near the electronic component to help with cooling the component.

Figure 3:
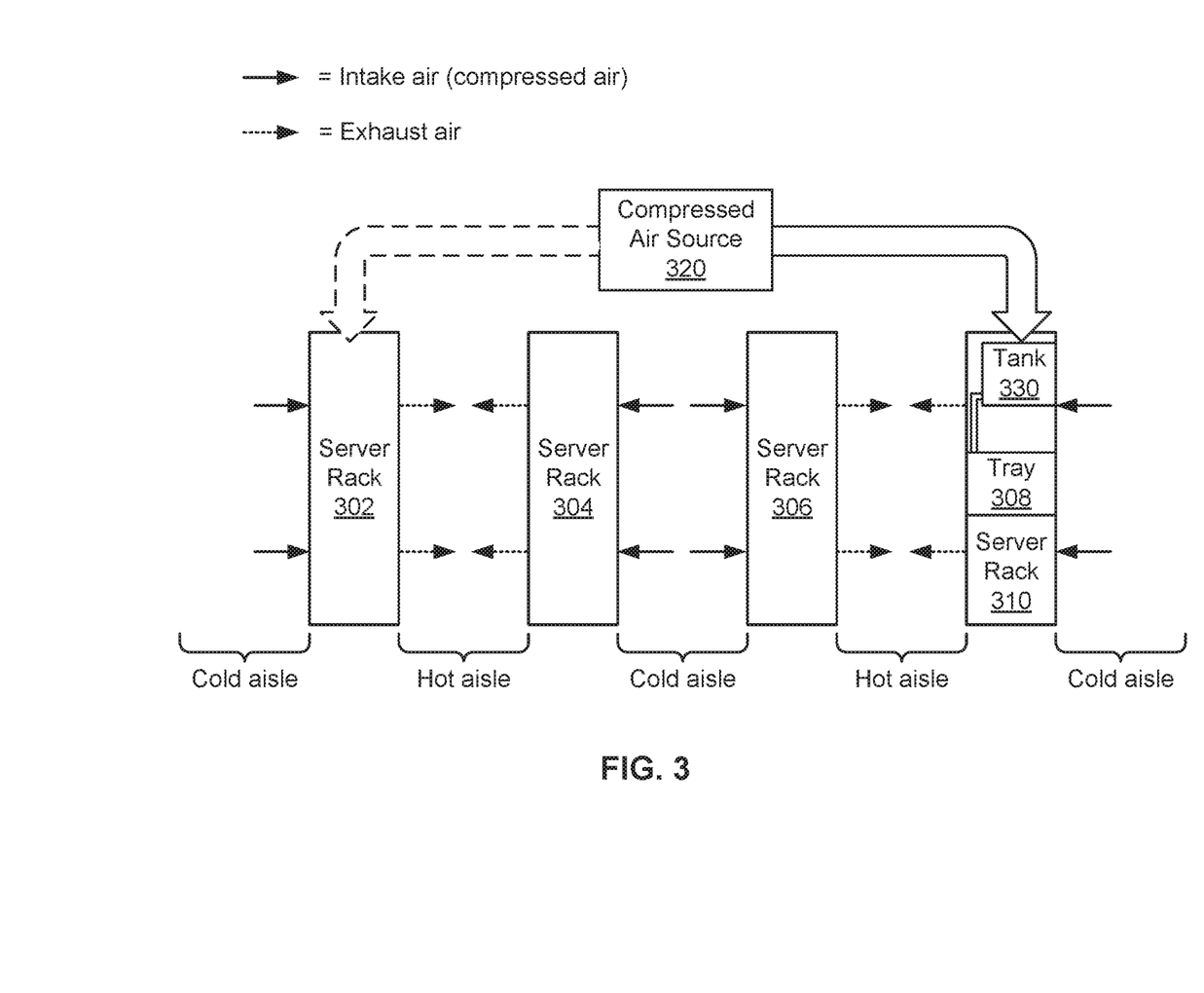
FIG. 3 is a block diagram of a data center with a compressed air cooling system according to an embodiment.
Figure 4:
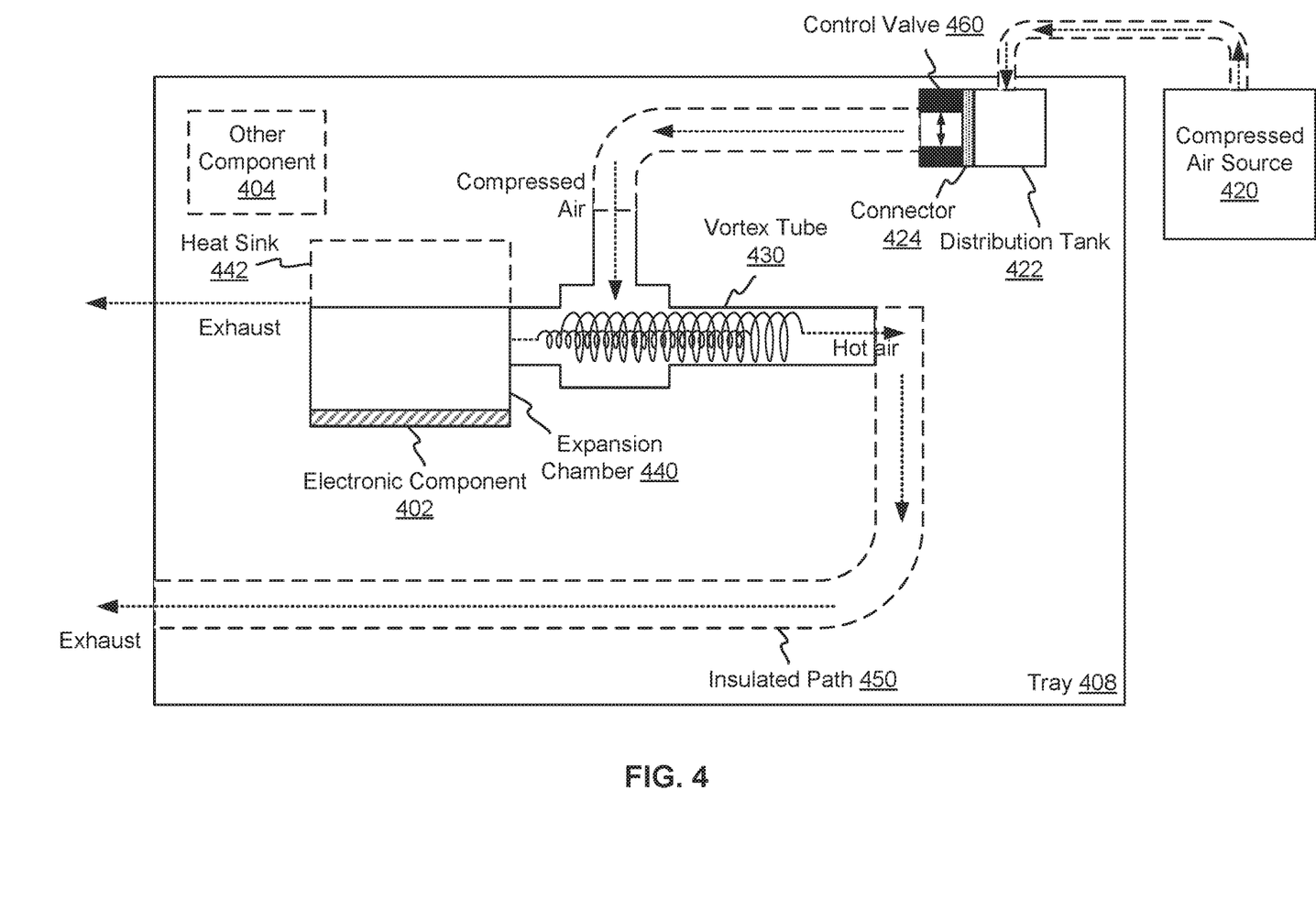
FIG. 4 is a block diagram of a server tray in which compressed air cooling is provided according to an embodiment.

For many electronic components, this type of convection cooling using ambient air is sufficient. However, as electronic components (such as server chips) become more computationally powerful, they also tend to generate more heat and simple convection cooling does not maintain the ideal operating temperature range for the electronic component. In addition, fans tend to block air, generate their own heat, and add extra weight and complexity (e.g., moving parts) to the server assembly, which can increase operating costs. FIGS. 3 and 4 show an example of a data center, server assembly, and tray that use compressed air to cool electronic components, which provides increased cooling compared to traditional convection cooling and also removes the need for a fan in the tray.

FIG. 3 is a block diagram of a data center with a compressed air cooling system according to an embodiment. This figure is an example where the compressed air is compressed by a compressed air source 320. In this example, from the perspective of the server racks 302-310, the compressed air source is a remote air compressor.

In some embodiments, such as the example shown here, the compressed air source is adapted to deliver compressed air to several server racks. Compressed air is cooler as it expands than ambient air, so cooler air is delivered to the server racks, taken into the trays of the server racks, passes over electronic components in the trays to cool the components, and exits to the hot aisles. The compressed air of the compressed air source can be delivered via outlets or vents in the compressed air source apparatus and/or delivered to the server racks via a conduit such as a hose, pipe, or other apparatus, which may be rigid or flexible. In some embodiments, the exhaust air in the hot aisles is recirculated, for example, taken in by the compressed air source 320, cooled, and the process of delivering compressed air to the server racks is repeated. The compressed air source can be implemented using one or more air compressors. In some embodiments, compressed air source 320 includes a component that filters/reduces moisture in the discharged air. For example, a filter, a water trap, a desiccant, and/or a refrigerated air dryer is utilized.

Here, compressed air source 320 compresses intake air (such as ambient air), and provides the compressed air to several server racks 302-310 via distribution tank(s) 330. For simplicity, a single distribution tank 330 is shown, but each of the other server racks 302-306 may have its own distribution tank. Compressed air from source 320 is delivered to distribution tank 330. The tank is adapted to store and distribute the compressed air according to server rack needs such as temperature or load of electronic components in the server rack. The amount of air distributed can be controlled based on factors and using regulating mechanisms as further described below. In this example, the tank 330 is coupled to tray 308 via a conduit such as a hose, pipe, or other apparatus. Compressed air is delivered to the tray via the conduit.

In some embodiments, a compressed air source is adapted to deliver compressed air to a specific server or tray within a server in a one-to-few or one-to-one relationship. For example, the compressed air source can be integrated with a server rack associated with the assembly and arranged to deliver compressed air directly into (or over a relatively short distance into) the trays of the server rack in which the compressed air source is provided.

In this example, the compressed air source 320 is depicted as being remote from the server racks. In some embodiments, instead of being compressed remotely, the air is compressed locally (relative to the server rack(s)). For example, a supercharger can be provided per server rack or per tray to cool air locally.

In various embodiments, an assembly for providing compressed air cooling to an electronic component includes an input configured to receive compressed air. The compressed air is directed to one or more electronic components that give off relatively more heat than other components inside the tray. For example, server chips may especially benefit from compressed air cooling because they tend to give off a great deal of heat. The cooler air can be directed via structures such as fins or a tube that focuses air to a desired direction or region. The assembly also includes an expansion chamber configured to (at least in part) contain an expansion of the compressed air. The assembly also includes a base configured to be thermally cooled via the expansion of the compressed air and configured to be coupled to an electronic component.

FIG. 4 is a block diagram of a server tray in which compressed air cooling is provided according to an embodiment. Unlike the tray of FIG. 2, this figure shows an example where tray components are cooled by compressed air and/or entrained air. The system shown in FIG. 4 includes a compressed air source 420, distribution tank 422, connector 424, control valve 460, vortex tube 430, and expansion chamber 440. The system is adapted to cool electronic component 402. The air is compressed by a compressed air source 420. An example of compressed air source 420 is the compressed air source 320 described above. In some embodiments, air source 420 is shared among a plurality of different server rack components. In other embodiments, air source 420 is an individual air source for tray 408 that is not shared with other server rack trays. In an alternative embodiment, air source 420 is included in tray 408.

Tray 408 can be installed inside a server rack such as 310, and a stack of trays can be provided in a server rack. FIG. 4 shows an example in which distribution tank 422 is provided inside the tray instead of outside (as in FIG. 3). Examples of tray 408 include a server, a storage device, a network device, a network switch, or any other rack mountable component. Electronic component(s) 402 and 404 in the tray generate heat, which can negatively impact device performance and, consequently, the performance of the servers/data center as a whole. Components in the tray can be cooled using the compressed air cooling techniques described below.

The compressed air source 420 is adapted to take in ambient air and pressurize the air. Compressed air is distributed to the distribution tank 422. The distribution tank 422 is adapted to store compressed air and deliver the compressed air to the system. When the compressed air is released via control valve 460, the air decompresses. The decompressing air released from control valve 460 is colder than ambient air because it expands and draws heat from the surroundings.

In some embodiments, the system shown in FIG. 4 includes a connector 424, which is adapted to permit the flow of compressed air to be quickly stopped. For example, connector 424 can be disengaged (e.g., snapped off) from the distribution tank 422 so that the flow of compressed air to the rest of the system is stopped. In some embodiments, if a tray is removed (being removed, has been removed) from a server rack, the connector automatically engages to stop a flow of compressed air. The flow of compressed air to the removed tray is automatically stopped by connector 424 to conserve resources. The flow of compressed air can instead be re-directed to other server racks or trays that are still installed. Also, when the server rack is being serviced, the automatic stopping of the compressed air makes it easier for a technician to check the server rack. The flow of compressed air can be automatically stopped for a variety of reasons including, without limitation, due to a fault, error, or emergency. Conversely, the connector 424 can (instead or also) be configured to initiate a flow of compressed air if a tray is plugged (being plugged, has been plugged) into a server rack. For example, when a tray is inserted into its slot in the server rack, the flow of compressed air is initiated. This makes it easier for a technician to complete servicing of the server rack without needing to take additional steps to re-initiate flow of compressed air. A sensor can be provided in the server rack and/or the tray to detect whether a tray has been removed or inserted into the server rack. The sensor signal can be sent to a controller associated with the compressed air source 420 to stop or start the flow of compressed air along a path to the tray in question.

The control valve 460 is adapted to control and regulate the amount (flow) of compressed air distributed to the system (including to the electronic component). The amount of airflow can be varied by changing the opening size of the control valve. In the example shown in FIG. 4, the size of the opening of control valve 460 can be varied in the direction of the arrows to increase or decrease the amount of air introduced to the rest of the system. This control valve is merely an example, and other control valves that control air flow in other ways (e.g., vary size in different directions or dimensions) can be used instead.

The control valve can be computer-controlled. For example, a computer instructs the control valve to introduce varying amounts of compressed air to the electronic component based on a state of the electronic component. The state of the electronic component can be reported by the component itself or can be measured by sensors in the tray/server rack. For example, a load or temperature of the electronic component can be used by the computer to determine the amount of compressed air to distribute to the electronic component via the control valve. More air is directed to an electronic component with a relatively high load or temperature. In some embodiments, the control valve is implemented by a proportional valve that uses the least amount of compressed air possible to provide adequate cooling for one or more tray components.

The vortex tube 430 is adapted to receive compressed air from an air compressor such as 420 (here via distribution tank 422 and control valve 460). The vortex tube is adapted to spin the air to further cool the air, and deliver the cold air out of the tube. This figure shows an example where the vortex tube 430 is coupled to the input (here, the input includes distribution tank 422 and connector 424). Compressed air is introduced to the top of the vortex tube, travels along the inside of the tube, and is delivered to the electronic component 402. The vortex tube is configured to spin a source compressed air to provide a colder compressed air to the input of the assembly and exhaust a warmer air. In other words, there is a temperature gradient going from colder air to warmer air so that the coldest air is at the center of the tube and the hottest air is at the outer circumference of the tube. Here, colder air is spun through the center and exits into the expansion chamber 440, while warmer air is spun out (directed away from the electronic component) and exits via insulated path 450 out the tray. The movement of the air, e.g., into the vortex tube and/or out of the vortex tube, also causes air outside the tube to be entrained. This means that ambient air is drawn past the tube.

Although not shown, heat fins may be provided inside at least a portion of the vortex tube to further cool the air passing through the tube. Heat fins may be provided on or near the electronic component to help with cooling the component.

The vortex tube can be made of a variety of materials. In some embodiments, the tube is rigid, for example, made of copper, steel, or other metal or composite. In some embodiments, the tube is flexible, for example, made of nylon, polyethylene, PVC, or any other elastomer or flexible polymer.

In some embodiments, a cooler output of vortex tube 430 is input to expansion chamber 440. The expansion chamber 440 is adapted to further cool air passing through the chamber by allowing the air to expand. In some embodiments, the expansion chamber 440 is coupled to an optional heat sink 442. An example of an expansion chamber with a heat sink assembly is as further described with respect to FIGS. 5A-7B. In some embodiments, the expansion chamber 440 is coupled to electronic component 402. In the example shown, at least a portion of the expansion chamber is contacting the electronic component. This can provide additional cooling to the electronic component (even more than the cooling provided to the interior of tray 408 generally).

In operation, a compressed air source 420 compresses air and delivers the compressed air to the tray 408. The compressed air can be held/stored in distribution tank 422. Airflow can be managed by a control valve 460, which controls the amount of air delivered to the vortex tube 430 depending on a desired level of cooling. Distribution tank 422 stores compressed air and can provide more or less compressed air depending on control valve 460. The amount of cooling to be provided (or amount of air to be delivered) may be determined by a computer based on a load on electronic component 402, or a temperature of the electronic component or inside the tray, among other factors. The vortex tube 430 receives compressed air and cools the compressed air further by spinning the air such that cold air exits through one end of the vortex tube coupled to the expansion chamber 440 as shown. Here, an expansion chamber is coupled to the vortex tube. The expansion chamber 440 has a base coupled to the electronic component. In this example, the cooler air closer to the center of the vortex tube is directed to the electronic component. The warmer exhaust air exits through another end of the vortex tube, is routed via an insulated path (tube) 450, and exits out the tray. In various embodiments, path 450 is insulated to prevent heating of the tray due to the exhaust air of the vortex traveling through the tray on its way out of the tray.

The cold air that exits the vortex tube 430 enters the expansion chamber 440 to provide cooling to the electronic component 402. In this example, the electronic component is contacting the bottom surface of the expansion chamber. Although not shown in detail in this figure, the expansion chamber may include other structures to help cool the air such as heat fins, heat pipes, and the like as further described with respect to FIGS. 5A-7B.

Upon cooling the electronic component 402, the exhaust air of the expansion chamber 440 is expelled from the tray 408 via the example path shown. In some embodiments, like the exhaust air of the vortex tube, the exhaust of the expansion chamber is simply delivered out of the tray to a hot aisle. In some embodiments, the exhaust air can be used to cool other components 404. Although the exhaust air of the expansion chamber is not as cool as the air entering that chamber, it may nevertheless be efficient to use the air to cool other components 404 which might not heat up as much as electronic component 402 or require less cooling than electronic component 402. For example, electronic component 402 can be a server chip that generates more heat than the other component 404. The coolest or cooler compressed air can be directed to the electronic component 402 while relatively warmer or entrained air is directed to the other component 404 to provide cooling to the other component. For example, the compressed air expanded in the expansion chamber is directed into a system chassis that includes the assembly to cool a different component (here, other component 404) within the system chassis.

The various movement of the air described above also entrains ambient air, because moving the compressed air or exhaust air draws additional (ambient) air into the tray along with the compressed air. In this example, the air from the right side of the diagram (e.g., from a cold aisle) is pulled into the tray. For example, the warmer exhaust air of the vortex tube is used to entrain ambient air into a system chassis that includes the assembly. As another example, the compressed air expanded in the expansion chamber is directed to entrain ambient air into a system chassis that includes the assembly. This can help to further cool the tray. The additional, entrained air also helps to cool interior tray components such as electronic component 402 and other component 404.

Unlike the tray of FIG. 2, compressed air cooling can provide more cooling (lower temperatures and/or higher volume) than conventional cooling techniques. In one aspect, compressed air provides sufficient cooling in the tray so that a fan is not required. This is an advantage over conventional cooling methods because this reduces the weight, complexity, and operational cost of servers.

The number and placement of the components is merely exemplary and not intended to be limiting. For example, in some embodiments, the control valve 460 is provided before the connector 424 and next to the distribution tank 422 rather than the configuration show in FIG. 4. Distribution tank 422 is depicted as being part of the tray while compressed air source 420 is outside the tray. In alternative embodiments, the distribution tank 422 may also be outside the tray or both the distribution tank and the compressed air source are inside the tray 408. FIGS. 5A-7B show examples of an expansion chamber.

Figure 5A:
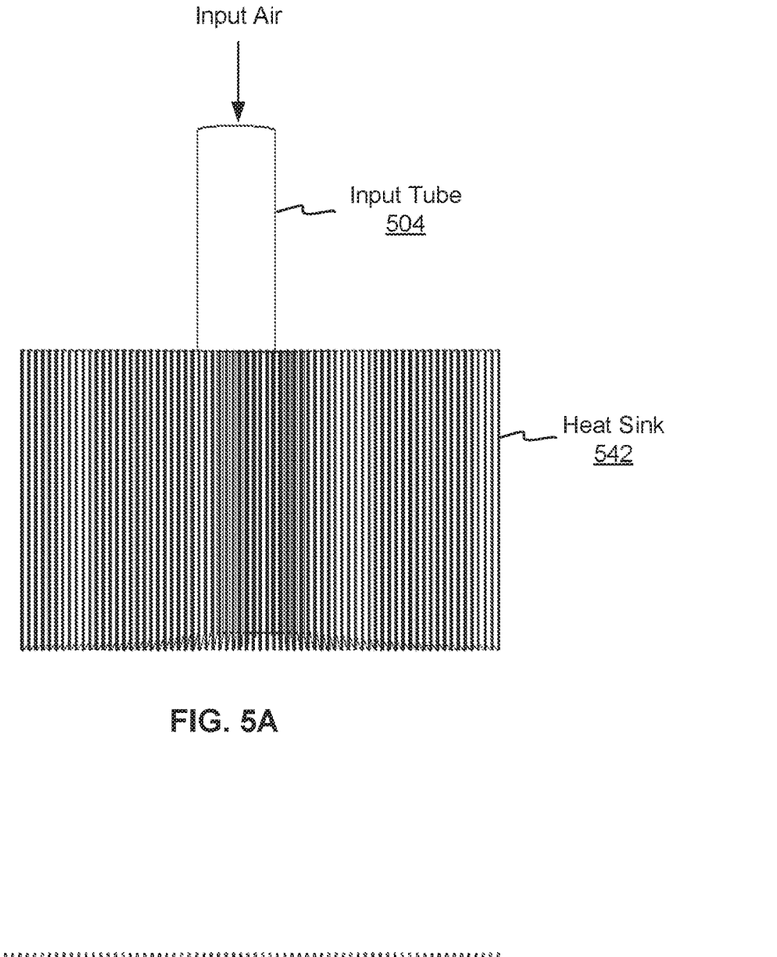
FIG. 5A is a top view of an apparatus for providing compressed air cooling according to an embodiment.

FIG. 5A is a top view of an apparatus for providing compressed air cooling according to an embodiment. The apparatus includes an input tube 504 coupled to a heat sink 542. The compressed air input received by input tube 504 can be compressed according to the techniques described herein such as with respect to FIG. 4. For example, output of a vortex tube can enter input tube 504.

Figure 7A:
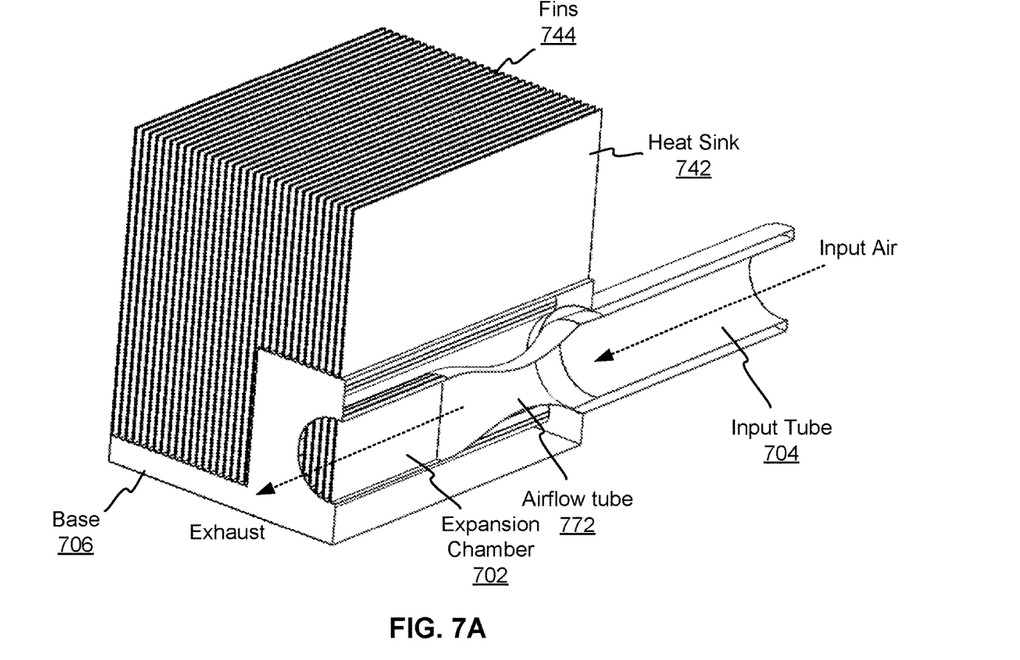
FIG. 7A is a cross-sectional view of an apparatus for providing compressed air cooling according to an embodiment.
Figure 7B:
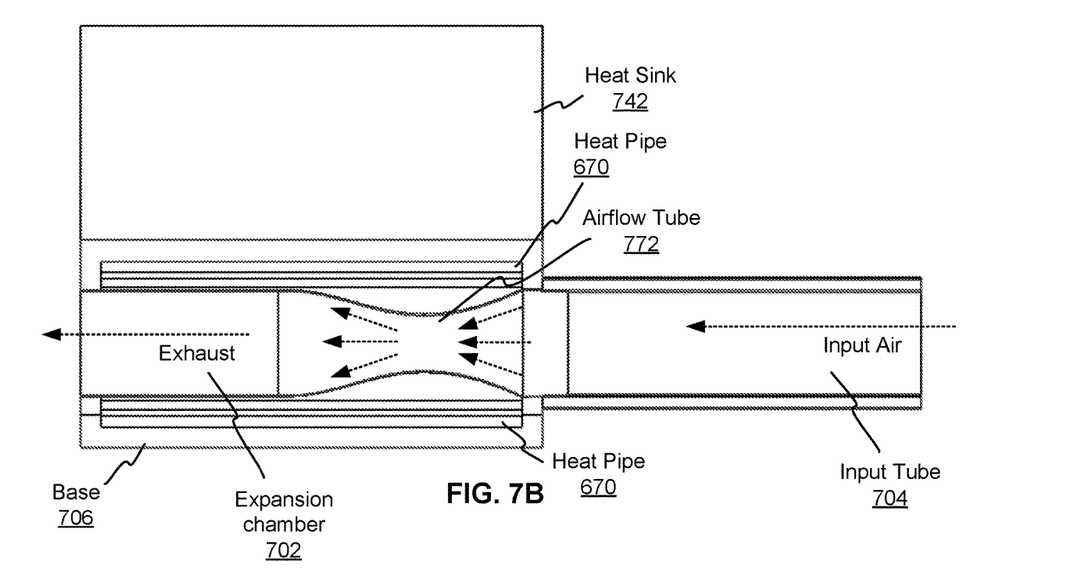
FIG. 7B is a side view of an apparatus for providing compressed air cooling corresponding to FIG. 7A.

An expansion chamber (more clearly illustrated in FIG. 5D) has a space to accommodate the expansion of air. The space can be implemented in a variety of ways. An example of an interior tube (sometimes called an airflow tube) with a neck for expanding air is shown in FIGS. 7A and 7B. When air is drawn into the vortex tube at the input, it passes through the relatively narrow passage of the input tube and expands inside the expansion chamber. The base of this assembly can be coupled to an electronic component to provide cooling. For example, the base can directly contact the electronic component as shown in FIG. 4.

This figure shows an example where the heat sink includes thermal exchanger fins. The thermal exchanger fins here are external to the expansion chamber and thermally connected to the expansion chamber and the base (as shown in FIG. 7A). In some embodiments, where the ambient air is cooler than the air in the expansion chamber, the fins are used to further cool the thermal exchanger (e.g., heat sink). In some embodiments, where the ambient air is warmer than the air in the expansion chamber, the thermal exchanger fins help to cool air passing though the fins to cool other components of the tray. The heat fins help to dissipate heat in the compressed air to further cool the air inside the expansion chamber. In other embodiments (e.g., FIG. 5D), the expansion chamber does not include heat fins.

In some embodiments, the bottom of the heat sink/ expansion chamber assembly can be made of a material or features different from the rest of the assembly. For example, the bottom does not have heat fins to aid in the stability of the apparatus and to provide flat surfaces to install connectors and the like.

Figure 5B:
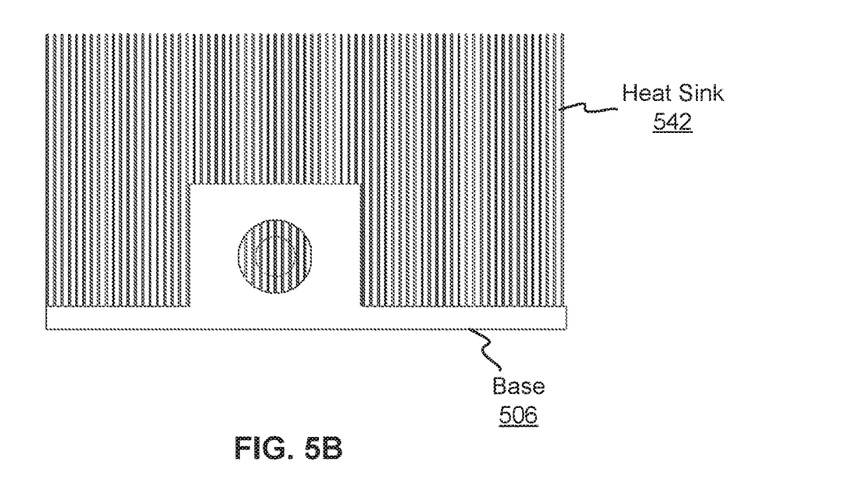
FIG. 5B is a front view of an apparatus for providing compressed air cooling according to an embodiment.

FIG. 5B is a front view of an apparatus for providing compressed air cooling according to an embodiment. In this view, the input tube is behind the heat sink 542 and thus out of sight. In some embodiments, the input tube is aligned with the base 506 so that air passes through the input tube, gets expanded in the expansion chamber, and exits at the opening shown. In some embodiments, the base 506 is coupled to the electronic component (not shown here, but an example is shown in FIG. 4) via a thermal paste. Here, the exit opening is circular. In this example, the circular exit opening allows cool air to contact an electronic component directly.

Figure 5C:
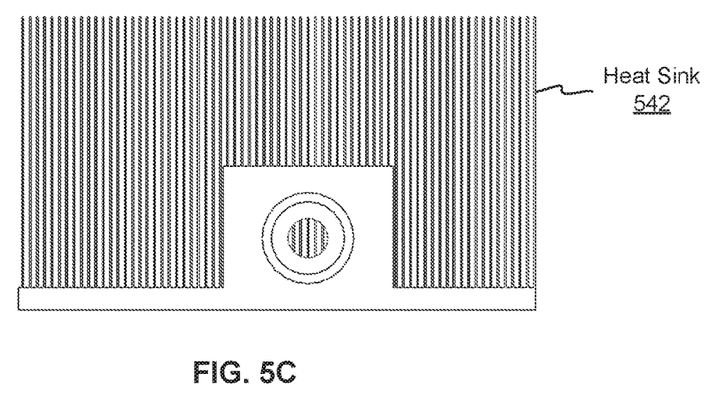
FIG. 5C is a back view of an apparatus for providing compressed air cooling according to an embodiment.

FIG. 5C is a back view of an apparatus for providing compressed air cooling according to an embodiment. In this view, the input tube has been removed to better show the opening in the expansion chamber adapted to receive the input tube. The input tube, when installed, is coupled to the circular section shown. This example also shows that an interior tube can be provided inside the expansion chamber to facilitate air flow and provide additional cooling. In this back view, the outside circular opening is larger than a section of the interior tube inside the expansion chamber. That is, there is a narrow neck inside the interior tube that further constricts and expands air to provide better airflow. This is illustrated in greater detail in FIGS. 7A and 7B.

Figure 5D:
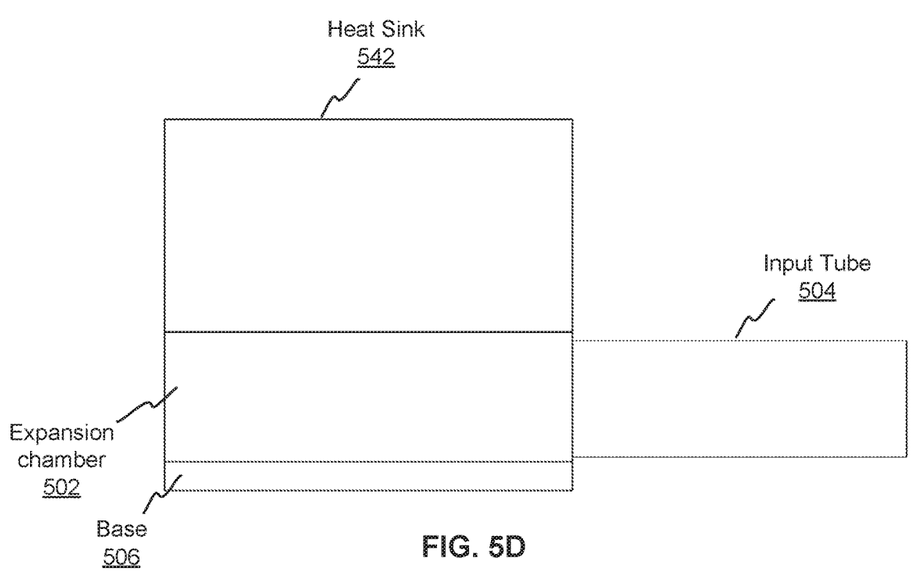
FIG. 5D is a side view of an apparatus for providing compressed air cooling according to an embodiment.

FIG. 5D is a side view of an apparatus for providing compressed air cooling according to an embodiment. In this example, the heat sink does not have heat fins. This also better illustrates the shape of the heat sink 542 and expansion chamber 502 relative to the input tube 504.

Figure 5E:
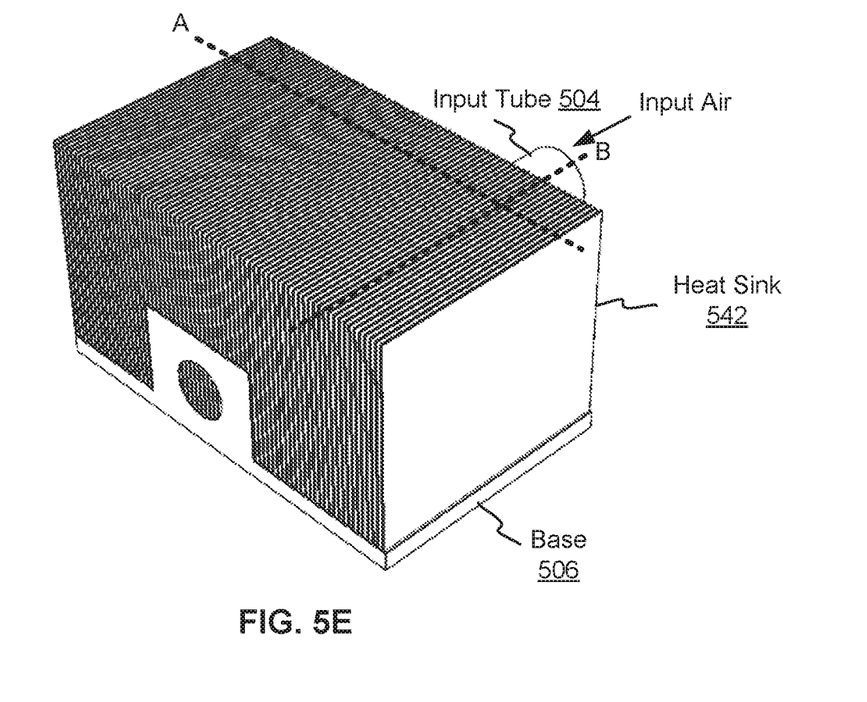
FIG. 5E is a front perspective view of an apparatus for providing compressed air cooling according to an embodiment.
Figure 6A:
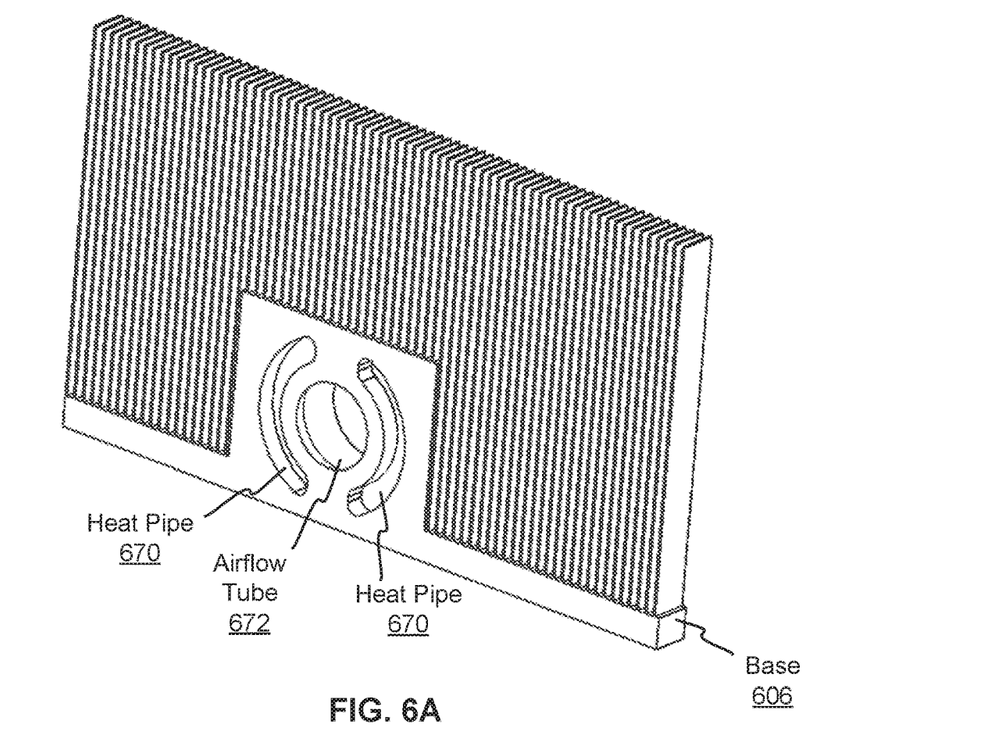
FIG. 6A is a cross-sectional view of an apparatus for providing compressed air cooling according to an embodiment.
Figure 6B:
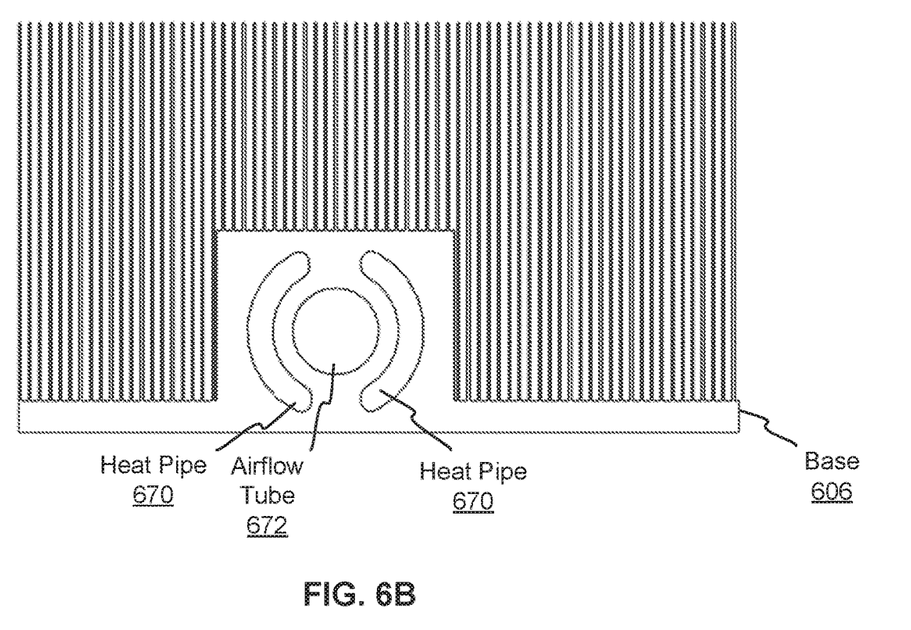
FIG. 6B is a front view of an apparatus for providing compressed air cooling corresponding to FIG. 6A.

FIG. 5E is a front perspective view of an apparatus for providing compressed air cooling according to an embodiment. The heat fins in this example extend throughout the heat sink except for the section near the base 506. A cross section of the heat sink/expansion chamber taken along dashed line "A" extending from the top to the base of the chamber is shown in FIGS. 6A and 6B. A cross section of the heat sink/expansion chamber taken along dashed line "B" extending from the top to the base of the chamber is shown in FIGS. 7A and 7B.

Figure 5F:
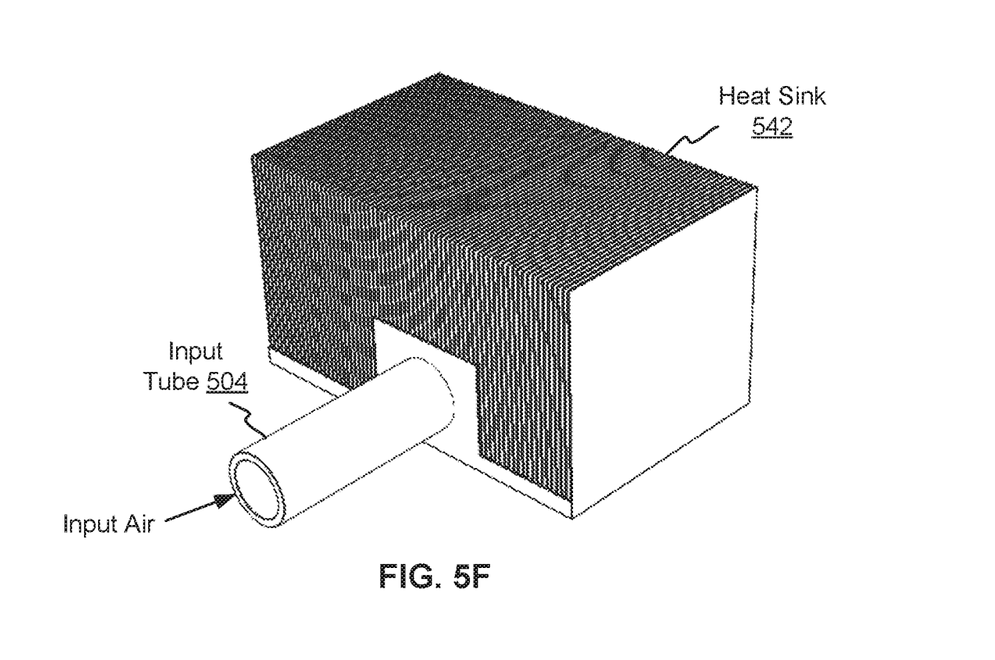
FIG. 5F is a back perspective view of an apparatus for providing compressed air cooling according to an embodiment.

FIG. 5F is a back perspective view of an apparatus for providing compressed air cooling according to an embodiment. As shown, the input tube 504 may have a relatively thin wall. Air is taken in via the input tube, expanded in the expansion chamber, and exits out the back via the base to the tray and/or a specific electronic component within the tray.

FIG. 6A is a cross-sectional view of an apparatus for providing compressed air cooling according to an embodiment. The cross section is taken along dashed line "A" extending from the top to the base of the chamber of FIG. 5E. FIG. 6B is a front view of an apparatus for providing compressed air cooling corresponding to FIG. 6A.

This example shows heat fins extending through the chamber except for base 606 and a section including heat pipe 670 and airflow tube 672. The base 606 is adapted to be coupled to an electronic component to provide cooling to the electronic component. The airflow tube 672 (sometimes called "interior tube") is coupled to the input tube to allow air to flow through the expansion chamber. In various embodiments, the airflow tube includes a narrowed neck. This is further described with respect to FIGS. 7A and 7B.

In this example, airflow tube 672 is partially surrounded by two sections of heat pipe 670. Heat pipe 670 is adapted to provide additional cooling. For example, each of the two sections of the heat pipe is filled with phase change material which changes from liquid to vapor depending on how hot an interface with the heat pipe gets. When an interface of the heat pipe is hot, a liquid in contact with a thermally conductive solid surface turns into a vapor by absorbing heat from that surface. The vapor then travels along the heat pipe to the cold interface and condenses back into a liquid to release the latent heat. This transfers heat between two solid interfaces.

FIG. 7A is a cross-sectional view of an apparatus for providing compressed air cooling according to an embodiment. The cross section is taken along dashed line "B" extending from the top to the base of the chamber of FIG. 5E. FIG. 7B is a side view of an apparatus for providing compressed air cooling corresponding to FIG. 7A.

The heat sink 742 corresponds to the heat sink 542. The thermal exchanger fins 744 are external to the expansion chamber 702 and thermally connected to the expansion chamber and the base 706. In this example, a tube runs from the outside of the expansion chamber to the inside of the chamber. For purposes of explanation, the section of the tube outside side chamber is called input tube 704 and the section of the tube inside the chamber is called airflow tube 772 (sometimes called the interior tube). The tube can be made of a single piece of material or different sections of material. As shown, airflow tube 772 is surrounded by two sections of heat pipe 670 (further described above with respect to FIGS. 6A and 6B). Expansion chamber 702 is coupled to the airflow tube (where the airflow tube has a narrowed neck portion).

In this example, the airflow tube 772 has a narrowed neck. The neck of the input tube provides further compression and facilitates air flow through the expansion chamber. When the compressed air flows through the airflow tube, the neck causes an additional compression and expansion along the arrows shown. This further cools the air such that the air is coldest at the neck of the airflow tube. An electronic component is coupled to base 706 of the expansion chamber and can be positioned so that the coldest part of the expansion chamber is aligned with the electronic component to provide the most cooling to the electronic component or portion of the electronic component that needs the most cooling. The exhaust air exits the expansion chamber along the arrow shown. Although not shown, thermal exchanger fins may be provided inside at least a portion of the airflow tube or within the expansion chamber 702 to further cool the air passing through the tube.

The techniques for compressed air cooling of electronic components effectively cool the electronic components, which improves the performance of the components and systems in which the components are used. For example, temperatures range from 392 F (200 C) to 58 F (−50 C). In addition, the techniques reduce complexity and cost because a fan is no longer required. The compressed air cooling techniques described here are also better than liquid cooling techniques because there is no risk of leakage into the server trays.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An assembly comprising:
an input configured to receive compressed air;
an expansion chamber configured to at least in part contain an expansion of the compressed air;
an airflow tube coupled between the input and the expansion chamber, wherein the airflow tube has a narrowed neck portion through which the received compressed air passes before entering the expansion chamber;
a heat pipe, wherein at least a portion of the airflow tube is at least partially surrounded by two sections of the heat pipe and the heat pipe is filled with a phase change material; and
a base coupled to and spanning a length of the expansion chamber and the airflow tube, wherein the base is configured to be thermally cooled via the expansion of the compressed air and configured to be coupled to an electronic component to cool the electronic component.

2. The assembly of claim 1, wherein the compressed air is compressed by an air compressor external to a server rack.

3. The assembly of claim 1, wherein the electronic component is an integrated circuit chip.

4. The assembly of claim 1, further comprising a distribution tank configured to store the compressed air and deliver the compressed air to the input.

5. The assembly of claim 1, further comprising a connector configured to automatically stop a flow of the compressed air in response to a tray being removed from a server rack.

6. The assembly of claim 1, further comprising a connector configured to automatically initiate a flow of the compressed air in response to a tray being plugged into a server rack.

7. The assembly of claim 1, wherein the input includes a control valve configured to control an amount of the compressed air distributed to the electronic component.

8. The assembly of claim 7, wherein the control valve is computer-controlled.

9. The assembly of claim 7, wherein the control valve is controlled based at least in part on at least one of: a load of the electronic component or a temperature of the electronic component.

10. The assembly of claim 1, further comprising a vortex tube coupled to the input, wherein the vortex tube is configured to spin a source of the compressed air to provide a colder compressed air to the input of the assembly and exhaust a warmer exhaust air.

11. The assembly of claim 10, wherein the warmer exhaust air is routed via an insulated tube.

12. The assembly of claim 10, wherein the warmer exhaust air is utilized to entrain ambient air into a system chassis that includes the assembly.

13. The assembly of claim 1, wherein the compressed air expanded in the expansion chamber is directed into a system chassis that includes the assembly to cool a different component within the system chassis.

14. The assembly of claim 1, wherein the compressed air expanded in the expansion chamber is directed to entrain ambient air into a system chassis that includes the assembly.

15. The assembly of claim 1, further comprising thermal exchanger fins external to the expansion chamber and thermally connected to the expansion chamber and the base.

16. The assembly of claim 1, further comprising thermal exchanger fins within the expansion chamber.

17. The assembly of claim 1, wherein the base is coupled to the electronic component via a thermal paste.

18. The assembly of claim 1, wherein the input, the airflow tube, and the expansion chamber are coupled in sequence and the expansion chamber is downstream of the airflow tube.

19. The assembly of claim 1, wherein the heat pipe extends through at least a portion of the expansion chamber in a same direction as the airflow tube.

20. A method comprising:

receiving compressed air;

guiding the compressed air through an airflow tube coupled between an input receiving the compressed air and an expansion chamber, wherein at least a portion of the airflow tube is at least partially surrounded by two sections of a heat pipe and the heat pipe is filled with a phase change material;

compressing the compressed air further via a narrowed neck portion inside the airflow tube;

allowing the compressed air to expand within the expansion chamber configured to at least in part contain an expansion of the compressed air; and cooling via the expansion of the compressed air and a conductive base coupled to and spanning a length of the expansion chamber and the airflow tube, an electronic component coupled to an assembly that includes the expansion chamber.

\* \* \* \* \*